(12) United States Patent
Lee et al.

(10) Patent No.: US 8,188,651 B2
(45) Date of Patent: May 29, 2012

(54) ORGANIC LIGHT EMITTING DISPLAY APPARATUS

(75) Inventors: Kyu-Sung Lee, Yongin (KR); Jin-Ho Kwack, Yongin (KR); Hyo-Jin Kim, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 252 days.

(21) Appl. No.: 12/457,438

(22) Filed: Jun. 10, 2009

(65) Prior Publication Data

US 2009/0302749 A1 Dec. 10, 2009

(30) Foreign Application Priority Data

Jun. 10, 2008 (KR) .................. 10-2008-0054300

(51) Int. Cl.
*H01J 1/62* (2006.01)
*H01J 63/04* (2006.01)

(52) U.S. Cl. ........ 313/504; 313/506; 313/512; 977/932; 977/952

(58) Field of Classification Search .......... 313/498–512; 977/932, 952
See application file for complete search history.

(56) References Cited

U.S. PATENT DOCUMENTS

| 7,358,538 | B2 * | 4/2008 | Lu et al. | 257/97 |
| 7,772,756 | B2 * | 8/2010 | Sakata et al. | 313/498 |
| 2005/0024293 | A1 * | 2/2005 | Sakata et al. | 345/30 |
| 2006/0099448 | A1 * | 5/2006 | Lu et al. | 428/690 |
| 2006/0228543 | A1 * | 10/2006 | Lu et al. | 428/323 |
| 2006/0251924 | A1 * | 11/2006 | Lu et al. | 428/690 |
| 2007/0090387 | A1 * | 4/2007 | Daniels et al. | 257/99 |
| 2010/0265105 | A1 * | 10/2010 | Sakata et al. | 340/995.1 |

* cited by examiner

*Primary Examiner* — Peter Macchiarolo
*Assistant Examiner* — Thomas A Hollweg
(74) *Attorney, Agent, or Firm* — Robert E. Bushnell, Esq.

(57) ABSTRACT

Provided is an organic light emitting apparatus that prevents voltage drop due to thin electrode and improves shock resistance. The organic light emitting apparatus includes a substrate, a first electrode formed on the substrate, an organic light emitting layer formed on the first electrode, a second electrode formed on the organic light emitting layer, and a conductive component disposed on the second electrode. The conductive component includes carbon nano-tubes.

4 Claims, 2 Drawing Sheets

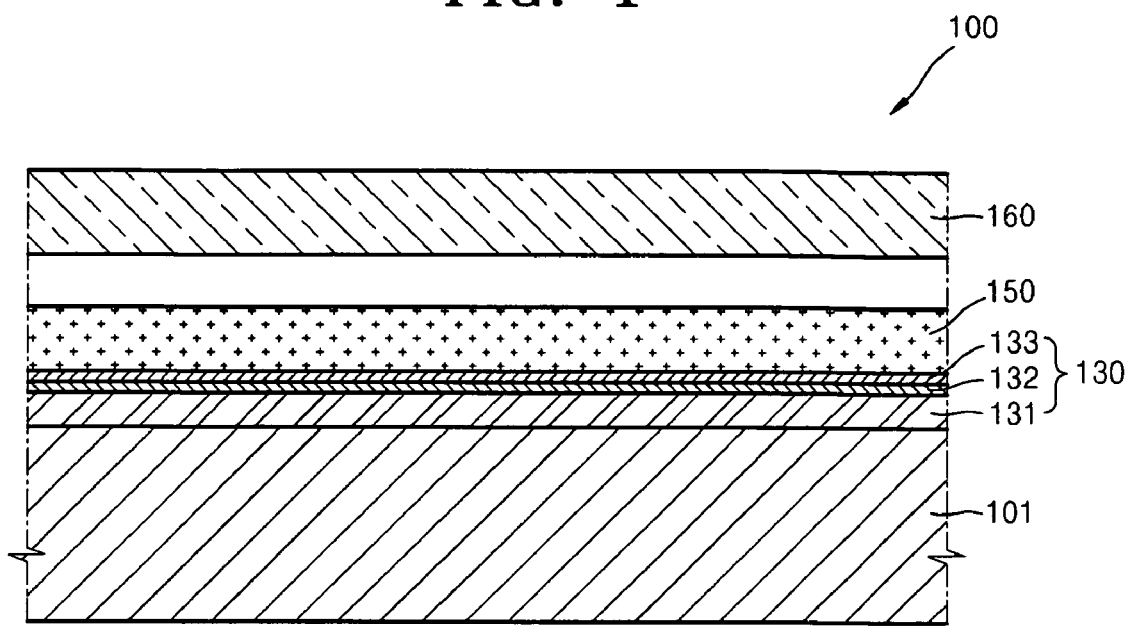
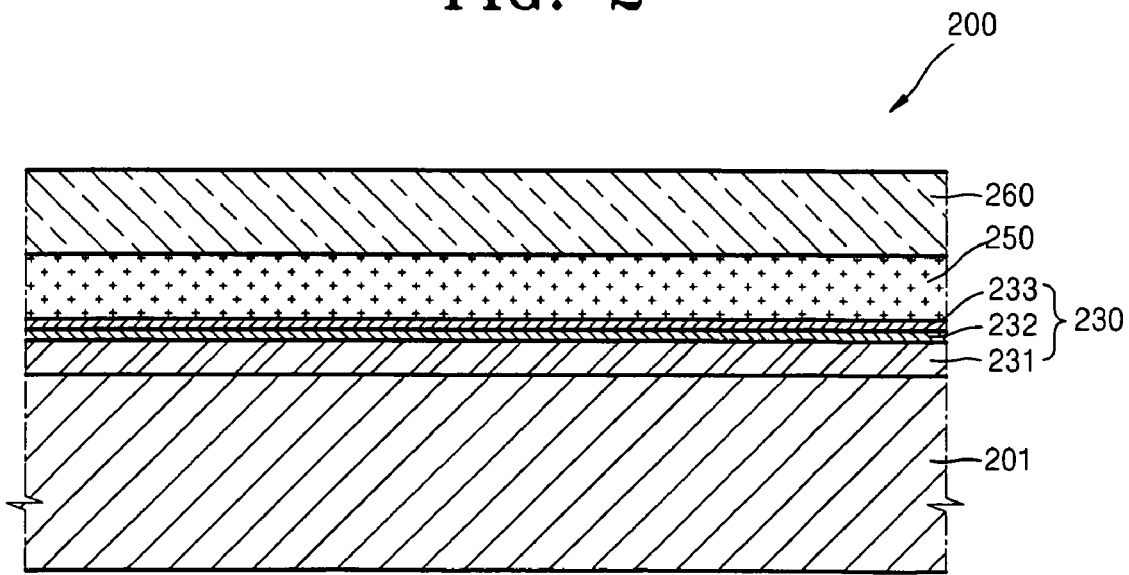

ORGANIC LIGHT EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 10 Jun. 2008 and there duly assigned Serial No. 10-2008-0054300.

BACKGROUND OF THE INVENTION

1. Field of the Invention

The present invention relates to an organic light emitting apparatus, and more particularly, to an organic light emitting apparatus preventing a current-resistance (IR) drop and having an organic light emitting device with improved shock resistance.

2. Description of the Related Art

Flat, thin, and portable panel display apparatuses are nowadays frequently used. Examples of flat panel display apparatuses include light emitting display (LED) apparatuses and organic light emitting display (OLED) apparatuses. A LED apparatus is a self-luminant type display apparatus with wide view angle, excellent contrast, and high response speed. Thus, the LED apparatus is becoming popular as the next-generation display apparatus. Also, an OLED apparatus having a light emitting layer formed of an organic material has superior brightness, driving voltage, and response speed characteristics as compared to an inorganic light emitting display apparatus. Furthermore, multi-colorization is possible in the OLED.

In the OLED apparatus, an image is embodied by forming an organic material layer between two electrodes for applying a voltage to the organic material layer. The electrodes are formed as thin-films to reduce the overall thickness of the OLED apparatus and to improve transmission of visible rays.

However, as thickness of electrodes is smaller, the electrical resistance thereof increases. Thus, a current-resistance (IR) drop, which is a voltage drop, occurs. Specifically, as the size of the OLED apparatus increases, the IR drop becomes more significant. As a result, power consumption increases and the overall image quality of the OLED apparatus becomes not uniform.

SUMMARY OF THE INVENTION

The present invention provides an organic light emitting apparatus preventing an IR drop and having an organic light emitting device with improved shock resistance.

According to an aspect of the present invention, there is provided an organic light emitting display (OLED) apparatus including a substrate, a first electrode formed on the substrate, an organic light emitting layer formed on the first electrode, a second electrode formed on the organic light emitting layer, and a conductive component disposed on the second electrode. The conductive component comprises carbon nanotubes.

The transmittance of the conductive component in visible rays may be between 30 percent and 99 percent.

The conductive component may be disposed to completely cover the second electrode.

The OLED apparatus may further include a sealing member disposed on the second electrode to seal the first electrode, the organic light emitting layer, and the second electrode. In this case, the conductive component may be disposed between the second electrode and the sealing member. The conductive component may contact both of the second electrode and the sealing member.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 is a sectional view illustrating an organic light emitting display (OLED) apparatus according to an embodiment of the present invention;

FIG. 2 is a sectional view illustrating an organic light emitting display (OLED) apparatus according to another embodiment of the present invention.

DETAILED DESCRIPTION OF THE INVENTION

Figure 3:
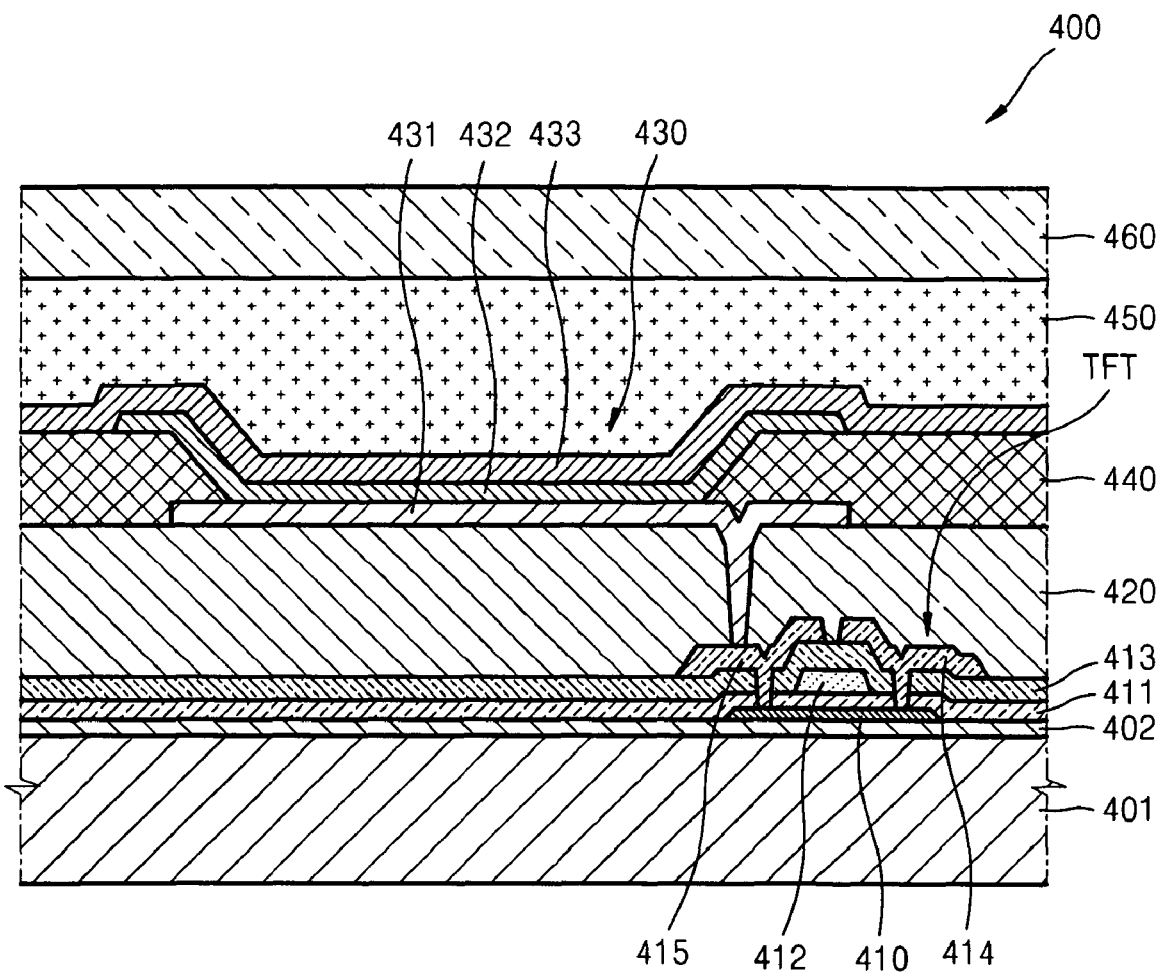
FIG. 3 is a sectional view illustrating an organic light emitting display (OLED) apparatus according to another embodiment of the present invention.

The present invention will now be described more fully with reference to the accompanying drawings, in which exemplary embodiments of the invention are shown.

FIG. 1 is a sectional view illustrating an organic light emitting display (OLED) apparatus according to an embodiment of the present invention. The OLED apparatus includes a substrate 101, an organic light emitting device 130, and a conductive component 150.

The substrate 101 can be formed of a transparent $SiO_2$ glass material. However, the substrate 101 can be also formed of a transparent plastic material. The plastic material forming the substrate 101 may be an insulating organic material, such as polyethersulphone (PES), polyacrylate (PAR), polyetherimide (PEI), polyethyelenennapthalate (PEN), polyethyelene-terepthalate (PET), polyphenylene sulfide (PPS), polyallylate, plyimide, polycarbonate (PC), cellulose tree acetate (TAC), or cellulose acetate propionate (CAP).

If the OLED apparatus is a bottom emission type apparatus in which an image is shown in a direction toward the substrate 101, the substrate 101 is required to be formed of a transparent material. However, if the OLED apparatus is a top emission type apparatus in which an image is shown in a direction opposite to the substrate 101, it is not necessary to form the substrate 101 of a transparent material. In the latter case, the substrate 101 can be formed of a metal. In case where the substrate 101 is formed of a metal, the substrate 101 may contain one or more of carbon, iron, chrome, manganese, nickel, titanium, molybdenum, stainless steel (SUS), Invar alloy, Inconel alloy, and Kovar alloy. However, the present invention is not limited thereto. The substrate 101 can be formed as a metal foil.

Although not shown, a buffer layer (not shown) may further be disposed on top of the substrate 101 for smoothness of the substrate 101 and preventing osmosis of impurities.

An organic light emitting device 130 is formed on the substrate 101. The organic light emitting device 130 includes first and second electrodes 131 and 133 facing each other and an organic light emitting layer 132 disposed between the first and second electrodes 131 and 133.

In case where the OLED apparatus is a top emission type apparatus in which an image is shown in a direction toward the second electrode 133, the first electrode 131 may be a reflective electrode and the second electrode 133 may be a transmissive electrode. The first electrode 131 functioning as a reflective electrode can be formed by forming a reflective layer of Ag, Mg, Al, Pt, Pd, Au, Ni, Nd, Ir, Cr, Li, Ca, or their compounds and forming ITO, IZO, ZnO, In$_2$O$_3$, having large work function, on the reflective layer. The second electrode 133 functioning as a transmissive electrode can be formed by depositing metals with small work functions, such as Ag, Mg, Al, Pt, Pd, Au, Ni, Nd, Ir, Cr, Li, Ca, or their compounds, and disposing a transparent conductive material, such as ITO, IZO, ZnO, or In$_2$O$_3$ on top of the metals.

If the OLED apparatus is a dual emission type apparatus, both the first electrode 131 and the second electrode 133 may be transmissive electrodes.

If the OLED apparatus is a bottom emission type apparatus in which an image is shown in a direction toward the substrate 101, the first electrode 131 may be a transmissive electrode and the second electrode 133 may be a reflective electrode. The first electrode 131 can be formed of a material with high work function, such as ITO, IZO, ZnO, or In$_2$O$_3$, whereas the second electrode 133 can be formed of a material with small work function, such as Ag, Mg, Al, Pt, Pd, Au, Ni, Nd, Ir, Cr, Li, or Ca. The first electrode 131 may be patterned in the form of lines or stripes apart from each other if the OLED apparatus is a passive matrix type (PM) display device. If the OLED apparatus is an active matrix type (AM) display device, the first electrode 131 may be patterned in correspondence with pixels.

The shape of the second electrode 133 may be stripes perpendicularly crossing the pattern of the first electrode 131 in case of the PM. If the OLED apparatus is an AM type display device, the second electrode 133 can be formed over an entire active region in which an image is displayed.

The organic light emitting layer 132 interposed between the first electrode 131 and the second electrode 133 emits light when the first electrode 131 and the second electrode 133 are electrically driven. The organic light emitting layer 132 can be formed of either a small molecular weight organic material or a high molecular weight organic material. If the organic light emitting layer 132 is formed of a small molecular weight organic material, a hole transport layer and a hole implant layer are stacked on organic light emitting layer toward the first electrode 131, and an electron transport layer and an electron implant layer are stacked on the organic light emitting layer 132 toward the second electrode 133.

In addition, various layers may further be stacked if required. Furthermore, organic materials such as copper phthalocyanine (CuPc), N,N'-Di(naphthalene-1-yl)-N,N'-diphenyl-benzidine:NPB, tris-8-hydroxyquinoline aluminum (Alq3), etc. may also be used. Meanwhile, in case where the organic light emitting layer 132 is formed of a high molecular weight organic material, only a hole transport layer (HTL) may be disposed on the organic light emitting layer 132 toward the first electrode 131. The HTL, which is formed of a polymer material, that is, a poly-(2,4)-ethylene-dihydroxy thiophene (PEDOT), polyaniline (PANI), etc., and is disposed on top of the first electrode 131 by using an inkjet printing method or a spin coating method. The polymer organic light emitting layer 132 can be formed of p-phenylene vinylene (PPV), soluble PPV's, Cyano-PPV, polyfluorene, etc., and a color pattern thereof can be formed by using common methods such as an inkjet printing method, a spin coating method, a laser thermal printing method, etc.

The conductive component 150 is formed on the second electrode 133. The conductive component 150 includes carbon nano-tubes. The conductive component 150 including carbon nano-tubes can be formed by using methods such as a discharging method (i.e. an Arc discharging method), a chemical vapor deposition (CVD) method, a plasma enhanced CVD (PECVD) method, a laser ablation method, a screen printing method, or a sol-gel method.

The conductive component 150 has transmittance between 30 percent and 99 percent in visible rays. Thus, reduction of brightness can be prevented even in the top emission type. Either the thickness of the conductive component 150 or the composition of the carbon nano-tubes may be changed such that the conductive component 150 has the transmittance as described above. Furthermore, an adhesive material may be added to the conductive component 150 in addition to the carbon nano-tubes so that the surface of the conductive component 150 becomes uniform. The conductive component 150 can be formed to completely cover the second electrode 133.

The carbon nano-tubes forming the conductive component 150 are carbon allotropes formed of carbon. In the carbon nano-tubes, a carbon atom is combined to other carbon atoms in hexagonal honeycomb shape to form tubes. The diameters of the tubes are in the range of nanometers. Furthermore, the carbon nano-tubes can be operated at normal temperature and have excellent conductivity and fast response speed. These advantages are due to the inherent properties of carbon nano-tubes. The carbon nano-tubes are formed of molecules in the shape of a tube formed by rolling graphite plates (sp2) formed of carbons connected to each other in hexagonal links. The diameter of carbon nano-tubes is between several nanometers and several tens of nanometers. The carbon nano-tubes are very solid yet flexible, and are not damaged or worn down by repeated use.

A sealing member 160 may be disposed on the organic light emitting device 130. More particularly, the sealing member 160 is formed to protect the organic light emitting device 130 from external agents or moisture. The sealing member 160 is disposed on the conductive component 150 and seals the organic light emitting device 130. The sealing member 160 can be formed of a transparent material, such as glass, plastic, or a material having a structure in which a organic material and a non-organic material are stacked in a plurality of layers. In case of the bottom emission type apparatus, the sealing member 160 can be formed of a non-transparent material. In the present embodiment, other layers can be formed between the conductive component 150 and the sealing member 160.

The second electrode 133 is generally formed as a thin film. Thus, the surface resistance of the second electrode 133 increases as the size of the OLED apparatus increases. As a result, a voltage decreases as a result of current-resistance (IR) drop when the OLED apparatus operates. Thus, power consumption of the OLED apparatus increases. However, the OLED apparatus 100 of the present invention includes the conductive component 150, which is disposed on the second electrode 133 and includes the carbon nano-tubes. Thus, the resistance of the second electrode 133 can be lowered.

Furthermore, since an OLED apparatus is generally portable, the OLED apparatus may receive external shocks. If a shock is applied to a conventional OLED apparatus, the thin films included in the OLED device can be damaged easily. Specifically, damage to organic light emitting devices reduces the lifespan of the OLED apparatus.

However, the OLED apparatus 100 according to the present invention includes the conductive component 150 including the carbon nano-tubes. The carbon nano-tubes have high flexibility and high durability due to their inherent structures. As a result, the organic light emitting device 130 of the OLED apparatus 100 can be easily protected from shocks due to the conductive component 150.

FIG. 2 is a sectional view illustrating an OLED apparatus 200 according to another embodiment of the present invention. For convenience of explanation, only differences from the previous embodiment will be described. The OLED apparatus 200 includes a substrate 201, an organic light emitting device 230, and a conductive component 250.

The structure of the OLED apparatus 200 is mostly the same as that of the OLED apparatus 100 shown in FIG. 1, except that the conductive component 250 and a sealing member 260 contact each other. The organic light emitting layer 232 interposed between the first electrode 231 and the second electrode 233 emits light when the first electrode 231 and the second electrode 233 are electrically driven. The organic light emitting layer 232 is similar to the organic light emitting layer 132 of FIG. 1. The first electrode 231 is similar to the first electrode 131 of FIG. 1. The second electrode 233 is similar to the second electrode 133 of FIG. 1. The conductive component 250 can contact the sealing member 260 to control the thickness of the conductive component 250. Furthermore, the manufacturing conditions may be changed so that the conductive component 250 and the sealing member 260 contact each other.

Furthermore, the OLED apparatus 200 shown in FIG. 2 may be manufactured by forming the conductive component 250 on the sealing member 260 and disposing the sealing member 260 to face the substrate 201.

Thus, when shocks are applied to the sealing member 260, the conductive component 250 may absorb the shocks. As a result, the durability of the OLED apparatus 200 is improved. Furthermore, the gap between the sealing member 260 and the organic light emitting device 230 is reduced to minimize interference of visible rays emitted by the organic light emitting device 230. Thus, the pixel characteristic of the OLED apparatus 200 is improved.

FIG. 3 is a sectional view illustrating an OLED apparatus 400 according to another embodiment of the present invention. More particularly, the OLED apparatus 400 is of an active matrix type display. For convenience of explanation, only differences from the previous embodiments will be described.

The OLED apparatus 400 includes a substrate 401, a thin film transistor (TFT), an organic light emitting device 430, and a conductive component 450. The TFT is formed on top of the substrate 401. At least one TFT is formed per pixel. The TFTs are electrically connected to the organic light emitting device 430.

More particularly, a buffer layer 402 is formed on the substrate 401. An active layer 410 having a predetermined pattern is formed on the buffer layer 402. The active layer 410 can be formed of either an inorganic semiconductor such as amorphous silicon or poly silicon or an organic semiconductor. The active region 410 includes a source region, a drain region, and a channel region.

The source and drain regions can be formed by doping impurities into the active layer 410 formed of amorphous silicon or poly silicon. If the active region 410 is doped with III family atoms such as boron (B), a p-type semiconductor can be formed. Meanwhile, if the active region 410 is doped with V family atoms such as nitrogen (N), an n-type semiconductor can be formed. A gate insulation layer 411 is formed on top of the active region 410, and a gate electrode 412 is formed in a predetermined region on top of the gate insulation layer 411. The gate insulation layer 411 is a layer for insulating the active region 410 and the gate electrode 412, and can be formed of an organic material or a non-organic material such as $SiN_x$, $SiO_2$, etc.

Although the gate electrode 412 is formed of materials such as MoW, Al/Cu, etc., the present invention is not limited thereto. Various materials can be used according to the adhesiveness of the gate electrode 412 to adjacent layers and/or the planarity, the electrical resistance, the processes, etc., of layers onto which the gate electrode 412 is stacked. The gate electrode 412 is connected to a gate line (not shown) applying TFT on/off signals. An interlayer insulation layer 413 including a contact hole is formed on top of the gate electrode 412.

A source electrode 414 and a drain electrode 415 are formed to respectively contact the source region and the drain region of the active region 410 through the contact hole.

The TFT is protected by disposing a passivation layer 420 covering the TFT. The passivation layer 420 can be formed of an inorganic insulation layer and/or an organic insulation layer. Examples of inorganic insulation layers forming the passivation layer 420 may include $SiO_2$, $SiN_x$, $SiON$, $Al_2O_3$, $TiO_2$, $Ta_2O_5$, $HfO_2$, $ZrO_2$, BST, PZT, etc. On the other hand, examples of organic insulation layers forming the passivation layer 420 may include commonly used general-purpose polymers such as poly methyl methacrylate (PMMA) or polystyrene (PS), polymer derivatives having a phenol group, acryl group polymers, imid group polymers, arylether group polymers, amide group polymers, fluorine group polymers, p-xylene group polymers, vinyl-alcohol group polymers, and blended material of the same. The passivation layer 420 may also be formed by compositely stacking inorganic insulation layers and organic insulation layers.

A via hole is formed on the passivation layer 420. The drain electrode 415 formed beneath the passivation layer 420 is exposed in the via hole. A first electrode 431 of the organic light emitting device 430 is formed on top of the passivation layer 420.

The first electrode 431 may be formed as a predetermined pattern by using a photolithography method. The first electrode 431 is electrically connected to the drain electrode 415 of the TFT via the via hole.

A pixel defining layer 440 is formed of an insulation material to cover the first electrode 431 and the passivation layer 420. After a predetermined opening is formed on the pixel defining layer 440, an organic light emitting layer 432 of the organic light emitting device 430 is formed in a region defined by the opening. Then, a second electrode 433, which becomes the cathode of the organic light emitting device 430, is formed to completely cover all pixels.

The conductive component 450 is formed on the second electrode 433. The conductive component 450 includes carbon nano-tubes. The conductive component 450 including the carbon nano-tubes can be formed by using methods such as a discharging method (i.e. an Arc discharging method), a chemical vapor deposition (CVD) method, a plasma enhanced CVD (PECVD) method, a laser ablation method, a screen printing method, or a sol-gel method.

The conductive component 450 has transmittance between 30 percent and 99 percent in visible rays. Thus, reduction of brightness can be prevented even in the top emission type. The conductive component 450 can be formed to completely cover the second electrode 433.

A sealing member 460 is disposed on the conductive component 450 to seal the organic light emitting device 430 from outer atmosphere.

The OLED apparatus 400 according to the current embodiment can also prevent an IR drop due to increase of resistance of the second electrode 433, and thus reduce power consumption. Furthermore, the OLED apparatus 400 can easily protect the organic light emitting device 430 from shocks, and thus the durability of the OLED apparatus 400 is improved.

Although FIG. 3 illustrates that the conductive component 450 and the sealing member 460 contact each other, the conductive component 450 may not contact the sealing member 460 as illustrated in FIG. 1.

In an OLED apparatus according to the present invention, a second electrode and a sealing member include carbon nano-tube material to prevent an IR drop and to improve the shock resistance of the OLED.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display (OLED) apparatus comprising:
   a substrate;
   a first electrode formed on the substrate;
   an organic light emitting layer formed on the first electrode;
   a second electrode formed on the organic light emitting layer; and
   a conductive component disposed on the second electrode, the conductive component comprising carbon nano-tubes, with the conductive component completely covering the second electrode.

2. The OLED apparatus of claim 1, wherein the transmittance of the conductive component in visible rays is between 30 percent and 99 percent.

3. The OLED apparatus of claim 1, further comprising a sealing member disposed on the second electrode to seal the first electrode, the organic light emitting layer, and the second electrode, the conductive component disposed between the second electrode and the sealing member.

4. The OLED apparatus of claim 3, wherein the conductive component contacts both of the second electrode and the sealing member.

* * * * *